United States Patent [19]

Reed

[11] 3,937,983

[45] Feb. 10, 1976

[54] MOS BUFFER CIRCUIT

[75] Inventor: John A. Reed, Los Altos, Calif.

[73] Assignee: Intel Corporation, Santa Clara, Calif.

[22] Filed: Apr. 3, 1975

[21] Appl. No.: 564,855

Related U.S. Application Data

[63] Continuation of Ser. No. 380,348, July 18, 1973, abandoned.

[52] U.S. Cl. .............. 307/205; 307/214; 307/270; 307/DIG. 4
[51] Int. Cl.² ............... H03K 19/08; H03K 19/40; H03K 17/10
[58] Field of Search ......... 307/205, 214, 246, 251, 307/270, 279

[56] References Cited
UNITED STATES PATENTS

| | | | |
|---|---|---|---|
| 3,480,796 | 11/1969 | Polkinghorn et al. | 307/205 X |
| 3,601,637 | 8/1971 | Spence | 307/251 X |
| 3,631,267 | 12/1971 | Heimbigner | 307/251 X |
| 3,646,369 | 2/1972 | Fujimoto | 307/279 X |
| 3,714,466 | 1/1973 | Spence | 307/251 X |
| 3,740,660 | 6/1973 | Davies, Jr. | 307/251 X |
| 3,778,784 | 12/1973 | Karp et al. | 307/279 X |

OTHER PUBLICATIONS

Faggin et al., "Silicon–Gate Technology," Solid–State Electronics, Pergamon Press (1970); Vol. 13, No. 8, pp. 1125–1143.

Primary Examiner—Stanley D. Miller, Jr.
Assistant Examiner—L. N. Anagnos
Attorney, Agent, or Firm—Spensley, Horn & Lubitz

[57] ABSTRACT

An MOS dynamic buffer circuit described in terms of an inverter and used for inverting a timing signal is disclosed. Through the use of bootstrapping, the output from the inverter is equal to the voltage used to drive the inverter without having conduction through the output transistor when the inverter is not supplying an output signal. Thus, the inverter does not require the large amounts of standby power associated with prior art circuits.

9 Claims, 2 Drawing Figures

MOS BUFFER CIRCUIT

This is a continuation of application Ser. No. 380,348, filed July 18, 1973, and now abandoned.

BACKGROUND OF THE INVENTION

1. Field of the Invention

The invention relates to the field of MOS buffer circuits such as inverter circuits.

2. Prior Art

In MOS circuitry there is often a need for controlling one signal with another such as controlling the output of a circuit with an input signal or for buffering a signal. In such circuits it is often desirable or necessary to have the output voltage equal to or very close to the source of potential used to power the circuit. More specifically, on an MOS chip, it is necessary in some cases to generate signals such as the inverse or complement of a timing signal where the inverse of complement is of the same magnitude as the voltage used to power the chip. This is particularly important where the inverted signal is utilized to drive other MOS devices on the chip.

Most often the output signal from a buffer or inverter is controlled by an output MOS device such as a field effect transistor. These devices generally have a voltage drop approximately equal to a threshold voltage between their source and drain terminals. Even where the potential applied to the gate of the output MOS device is equal to the potential applied to this device, this voltage drop exists. It is necessary to apply a potential to the gate of the output MOS device which is greater than the source of potential applied to the terminals of the device in order to avoid the undesirable threshold voltage drop.

Bootstrapping is a well known prior art technique for generating a voltage in an MOS circuit which is greater than the potential applied to the circuit. It is often used where it is necessary to avoid the effects of the threshold drop of an MOS device. Most often the bootstrapping utilizes a capacitor such as Miller capacitance to raise the potential on the gate of an MOS device to a potential greater than the potential across the source and drain of the device so that the effects of the threshold drop may be eliminated. Typically, in order to bootstrap the output transistor of a circuit, current must be supplied to that transistor when it is not supplying an output signal. Often the output transistor is large so it may drive other circuits and the standby power consumed by this device causes the circuit to be inefficient.

As will be seen, the present circuit utilizes a plurality of bootstrap circuits and a feedback path to provide a control circuit which is disclosed in the form of an inverter. The output signal is equal to the voltage used to power the circuit. The output transistor does not draw any current, except that supplied to the output.

SUMMARY OF THE INVENTION

An MOS buffer circuit utilized for producing the complement of a timing signal is described. The output from the buffer is derived from the source of an MOS device which is coupled to the source of potential used to supply power for the buffer. The gate of this output MOS device is sequentially coupled to a first bootstrap circuit and then to a second bootstrap circuit. A feedback MOS device which has its gate coupled to the output, senses the rise in the output potential and causes the potential supplied to the gate of the output MOS device to be changed from the first bootstrap circuit to the second bootstrap circuit. The first bootstrap circuit applies a potential to the gate of the output MOS device approximately equal to the source of potential applied to the circuit while the second bootstrap circuit applies a potential to the gate of the MOS device which is greater than the source of potential applied to a circuit.

DETAILED DESCRIPTION OF THE INVENTION

Figure 1:
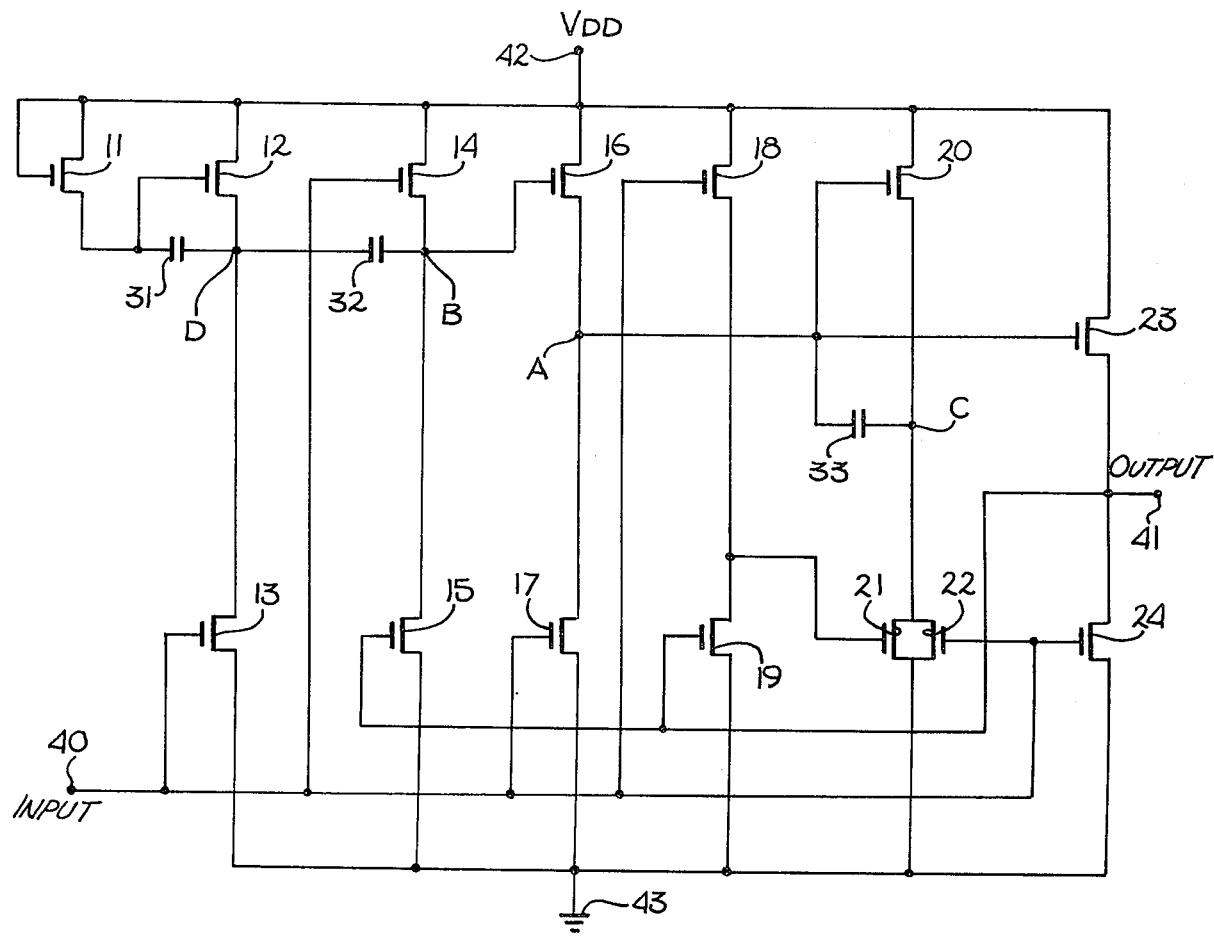
FIG. 1 is an electrical schematic of the presently invented MOS buffer circuit.
Figure 2:
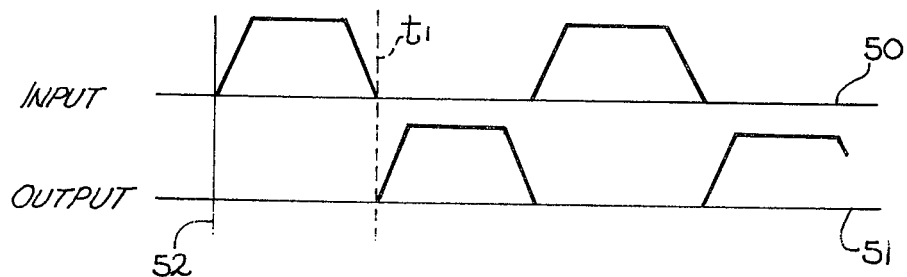
FIG. 2 illustrates the input and output waveforms for the circuit of FIG. 1.

Referring to FIG. 1, the dynamic buffer or inverting buffer of the present invention is illustrated. It includes an input (lead 40) and an output (lead 41). Referring briefly to FIG. 2, a typical input is illustrated on line 50, this input may be a periodic timing signal. A typical output is illustrated on line 51 which is the inverse or complement of the signal shown on line 50. The circuit illustrated in FIG. 1 is supplied power from a power source, line 42 designated as $V_{DD}$.

In the presently preferred embodiment the circuit of FIG. 1 is fabricated on an integrated circuit chip which includes a memory array and is utilized for generating timing signals in the memory array. Also in the presently preferred embodiment the entire circuit of FIG. 1 is fabricated utilizing MOS technology and in particular n-channel field effect transistors (FET) which employ polycrystalline silicon gates, although P-channel devices may be utilized. See copending applications Ser. No. 380,350 filed July 18, 1973, Ser. No. 380,349, filed on July 18, 1973 and Ser. No. 380,347, filed on July 18, 1973, now U.S. Pat. 3,858,185 both assigned to the assignee of this application for additional circuitry used in the memory array.

In FIG. 1 MOS devices 11, 12, 13 and 14 are utilized in conjunction with capacitors 31 and 32 as a bootstrapping circuit for producing a potential on node B which is greater than $V_{DD}$ and which is in fact close to 2 $V_{DD}$. MOS devices 11, 12, 13 and 14 are all MOSFETs, as are all the other MOS devices in the circuit of FIG. 1, which include a gate and two other terminals commonly referred to as the source and drain. MOS devices 11, 12 and 13 each have one of their terminals coupled to line 42, also the gate of device 11 is coupled to line 42. The other terminal of device 11 is coupled to the gate of device 12 and to one terminal of capacitor 31. The other terminal of device 12 is coupled to node D which is also common with the other terminal of capacitor 31, one terminal of capacitor 32 and one terminal of MOS device 13. The gate of MOS device 13 is coupled to the input line 40 while the other terminal of MOS device 13 is coupled to ground 43. The gate of MOS device 14 is likewise coupled to the input line 40 with the other terminal of device 14 being coupled to node B. Node B is formed by the other terminal of capacitor 32, the gate of MOS device 16 and one terminal of MOS devices 15 and 14.

As will be seen, MOS device 15 provides feedback from the output line 41 and causes node B to be discharged at an appropriate time. The gate of MOS device 15 is coupled to line 41 and the other terminal of device 15 is coupled to the ground 43.

MOS device 16 is utilized to initially turn-on the output MOS device 23 and has one of its terminals coupled to line 42 ($V_{DD}$) and the other of its terminals coupled to node A which is common with one terminal of MOS device 17. MOS device 17 allows node A to float when the signal is removed from the input line and hence has its gate coupled to the input line 40 and its other terminal coupled to ground 43.

MOS devices 18, 19, 20 and 21 are utilized as a delay circuit and for providing bootstrapping of node A to a potential greater than $V_{DD}$ at an appropriate time during the operation of the circuit as will be explained. MOS device 18 has one of its terminals coupled to line 42 and its other terminal coupled to one terminal of device 19 and the gate of MOS device 21. The gate of device 18 is coupled to the input line 40. MOS device 19 has its gate coupled to the output line 41 and its other terminal coupled to ground 43. MOS devices 20 and 21 are coupled in series with one terminal of device 20 being coupled to $V_{DD}$ and one terminal of device 21 being coupled to ground 43. The common junction between devices 20 and 21 is designated as node C, this node being common with one terminal of capacitor 33. The other terminal of capacitor 33 is coupled to node A, this node includes the gate of the output MOS device 23.

MOS device 22 has its gate coupled to the input 40 and one of its terminals coupled to node C and its other terminal coupled to ground 43. This device allows node C to float when the input signal to line 40 is zero. MOS device 24 also has its gate coupled to the input line 40 and has one of its terminals coupled to the output line 41 and its other terminal coupled to the ground 43. This device allows the output line 41 to be decoupled from the ground 43 when no input signal is applied to line 40. The output device 23 is coupled between the source of potential utilized to drive the circuit ($V_{DD}$) and the output line 41.

Assume for the purposes of discussion that at time $t = 0$ illustrated as line 52 in FIG. 2 the input to line 40 is high or positive (for the n-channel embodiment under discussion) and that at time $t = t_1$ the input drops to zero as illustrated on line 50. During the time that the input is positive or high, ($0 < t < t_1$) devices 12 and 13 are conducting and the gate of device 12 and one terminal of capacitor 31 is at a potential equal to $V_{DD}$ less the threshold drop of device 11. The conducting impedance of devices 12 and 13 is constructed such that node D, during this time is approximately at ground potential. That is, the conducting impedance of device 13 is much less than for device 12. This is the common arrangement for a capacitor type bootstrap circuit utilized in the MOS art. Also during this time node B (also capacitor 32) is charged to a voltage equal to $V_{DD}$ less the threshold drop of device 14.

When the input drops to zero at $t_1$, devices 13 and 14 cease conducting, causing the charge on capacitor 32 to be connected in series with the potential at node D and the total potential being applied to the gate of device 16. Note that the charge on capacitor 31 bootstraps device 12 such that node D rises to a potential approximating $V_{DD}$, thus the total potential applied to node B is approximately equal to twice $V_{DD}$. Therefore, devices 11, 12, 13 and 14 are utilized to bootstrap node B or the gate of device 16 to a potential substantially greater than $V_{DD}$.

As node B rises in potential it causes device 16 to conduct and allows node A to begin approaching the potential $V_{DD}$. Since device 16 is being driven with a voltage greater than $V_{DD}$, the potential on node A may rise to a potential equal to $V_{DD}$. Note that node A is left floating when the input signal drops to zero since device 17 ceases to conduct. As node A rises in potential it causes the output device 23 to begin conducting, thereby causing the output line 41 to rise in potential. As the output potential increases, device 15, the feedback device, begins to conduct. This causes node B to begin discharging. As will be seen, the discharge of node B prevents node A from being clamped to $V_{DD}$ and allows node A due to the bootstrapping of capacitor 33 to rise to a potential greater than $V_{DD}$.

As the potential on the output line 41 increases, it also causes device 19 to conduct thereby turning off device 21. When this occurs node C is allowed to float. Prior to the time that node C is allowed to float, this node has been charged through device 20 to a substantial potential, although a potential less than $V_{DD}$. After node C begins to float the charge on capacitor 33 remains substantially constant and node A will increase to a potential determined by the charge delivered through device 16 and the change in voltage on node C. The timing delay of devices 18, 19, 20 and 21 is such as to allow enough time for the charge on node A to build to a significant voltage before node C begins to move. When the voltage on line 41 rises sufficiently to discharge node B through the feedback device 15, thereby causing device 16 to cease conduction, node A no longer being clamped to $V_{DD}$, rises to a potential greater than $V_{DD}$. This potential is equal to the voltage on node C plus the voltage across capacitor 33. Since a potential greater than $V_{DD}$ is applied to the gate of device 23 the output line will be substantially clamped to $V_{DD}$.

When the input signal again rises the output will drop to ground potential since devices 17 and 24 begin conducting.

In typical applications device 23 will be utilized to drive a plurality of other circuits such as in a memory array. Thus, device 23 will be particularly large when compared to the other devices utilized in the circuit of FIG. 1.

If the prior art bootstrapping techniques were to be utilized directly on the gate of the output MOS device 23, current would be drawn through this device even when the output line 41 was coupled to ground. Since device 23 is relatively large in many practical applications, a substantial amount of power would be required. Thus, the presently disclosed circuit when compared to prior art circuits, dissipates only a small amount of power.

Thus, an Mos inverter buffer has been disclosed which provides an output signal equal in potential to the potential applied to the buffer. The circuit may be fabricated utilizing known MOS techniques.

I claim:
1. An MOS control circuit for controlling an output signal, said control circuit being coupled to a source of potential comprising:
   an output MOS device coupled to the output of said circuit and to said source of potential, said MOS device including a gate;
   a first circuit means for providing a first signal to said gate of said MOS device, said first circuit means including capacitance means;
   a second circuit means for providing a second signal to said gate of said MOS device, said second signal following said first signal and having a magnitude greater than said source of potential; and a third circuit means for electrically decoupling said capacitance means of said first circuit means from said gate of said MOS device as said second signal increases in magnitude so as to allow said second signal to increase in magnitude without restraint of said capacitance means of said first circuit means;

whereby said output signal may have a magnitude substantially equal to said source of potential.

2. An MOS control circuit for causing an output signal to approach the voltage of a source of potential comprising:

an output MOS device having a gate and two terminals, said one of said terminals being coupled to said source of potential and said other terminal to the output of said control circuit;

a first MOS circuit means for applying a first voltage to said gate of said output MOS device, coupled to said output MOS device, said first MOS circuit means including capacitance means;

a second MOS circuit for applying a second voltage to said gate of said output MOS device, coupled to said output MOS device, said second voltage having a magnitude greater than said source of potential;

feedback means, for feeding back said output signal such as to cause said second voltage to be applied to said gate of said output MOS device and to electrically decouple said capacitance means of said first MOS circuit from said gate;

whereby said output MOS device is first driven by said first voltage, then by said second voltage.

3. The circuit defined in claim 2 wherein said first MOS circuit means includes a bootstrap circuit.

4. The circuit defined in claim 2 wherein said second MOS circuit means includes a bootstrap circuit.

5. The circuit defined in claim 2 wherein said feedback means includes an MOS device having its gate coupled to said output signal.

6. The circuit defined in claim 2 wherein said circuit comprises n-channel MOS devices which utilize polycrystalline silicon gates.

7. A MOS control circuit having an input line for controlling an output line, said circuit being powered from a source of potential comprising:

an output MOS device having a gate and at least two terminals, one of said terminals coupled to said source of potential and said other terminal coupled to said output line for coupling said potential to said output line;

a second MOS device;

a first bootstrap circuit means for generating a voltage greater than said source of potential coupled between said input line and said second MOS device;

a second bootstrap circuit means for generating a voltage greater than said source of potential coupled between said output MOS device and said second MOS device; and feedback means for feeding back at least a portion of said output to said second MOS device;

whereby an output signal may be generated which is approximately equal to said source of potential.

8. The circuit defined in claim 7 wherein said feedback means includes an MOS device having its gate coupled to said output line.

9. The circuit defined in claim 8 wherein said circuit comprises n-channel MOS field effect transistors which employ polycrystalline silicon gates.

* * * * *